United States Patent
Kim

(10) Patent No.: US 8,330,424 B2
(45) Date of Patent: Dec. 11, 2012

(54) BATTERY'S STATE-OF-CHARGE BALANCING CONTROL METHOD FOR HYBRID VEHICLE

(75) Inventor: Jeong Eun Kim, Gyeonggi-do (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 311 days.

(21) Appl. No.: 12/781,180

(22) Filed: May 17, 2010

(65) Prior Publication Data

US 2011/0115439 A1    May 19, 2011

(30) Foreign Application Priority Data

Nov. 17, 2009    (KR) .................. 10-2009-0110676

(51) Int. Cl.
*H02J 7/00*    (2006.01)
*G06F 7/00*    (2006.01)

(52) U.S. Cl. .................. 320/136; 320/132; 701/22

(58) Field of Classification Search .................. 320/136, 320/132
See application file for complete search history.

(56) References Cited

U.S. PATENT DOCUMENTS

| | | | |
|---|---|---|---|
| 6,018,694 A * | 1/2000 | Egami et al. .................. 701/102 |
| 6,629,027 B2 * | 9/2003 | Yamaguchi et al. ............ 701/22 |
| 6,775,601 B2 * | 8/2004 | MacBain ........................ 701/22 |
| 2002/0188387 A1 | 12/2002 | Woestman et al. |
| 2011/0199053 A1 * | 8/2011 | Minamiura ................... 320/136 |

FOREIGN PATENT DOCUMENTS

| | | |
|---|---|---|
| JP | 2000-188802 A | 7/2000 |
| KR | 10-2003-0020982 | 3/2003 |
| KR | 10-2007-0097089 A | 10/2007 |
| KR | 10-2008-0028108 A | 3/2008 |
| KR | 10-0896216 | 4/2009 |
| KR | 10-2009-0062565 A | 6/2009 |

* cited by examiner

*Primary Examiner* — M'Baye Diao
(74) *Attorney, Agent, or Firm* — Edwards Wildman Palmer LLP; Peter F. Corless

(57) ABSTRACT

A battery's state-of-charge (SOC) balancing control method for a hybrid vehicle is provided, in which the outside air temperature at a traveling destination is reflected to perform the control.

3 Claims, 4 Drawing Sheets

BATTERY'S STATE-OF-CHARGE BALANCING CONTROL METHOD FOR HYBRID VEHICLE

CROSS-REFERENCE TO RELATED APPLICATION

This application claims under 35 U.S.C. §119(a) the benefit of Korean Patent Application No. 10-2009-0110676 filed Nov. 17, 2009, the entire contents of which are incorporated herein by reference.

BACKGROUND (a) Technical Field

The present disclosure relates to a battery's state-of-charge (SOC) balancing control method for a hybrid vehicle, in which the outside air temperature at a traveling destination is considered in determining an SOC strategy value.

(b) Background Art

Hybrid vehicles employ an electric motor as an auxiliary power source as well as an internal combustion engine to reduce exhaust gas and improvement fuel efficiency. The electric motor is driven by charge and discharge of a battery to increase the efficiency of a hybrid system (load leveling). Moreover, the battery is charged by regenerative braking during deceleration, in which the kinetic energy, which would be otherwise dissipated as frictional heat by a brake system, is converted into electrical energy by the power generation of the motor, thereby improving the fuel efficiency.

Various factors affect the fuel efficiency and driving performance of hybrid vehicles. One of the factors is the state-of-charge (SOC) of the battery.

The battery is an energy source for operating the motor of the hybrid vehicle and a DC/DC converter, and a battery controller monitors the voltage, current, and temperature of the battery and controls the overall SOC (%) of the battery. The operating point of the battery should be controlled such that the battery's SOC is maintained in a normal range and, if the battery's SOC is out of the normal range, it should be controlled to be restored to the normal range.

In an SOC band control of a high voltage battery, when the battery's SOC is lower than a preset value, the engine should be operated at an operating point higher than a desired power level to control the battery's SOC to charge orientation. On the contrary, when the battery's SOC is higher, the battery's SOC should be controlled to discharge orientation by increasing the amount of energy discharged from the electric motor.

A conventional SOC band control method of a high voltage battery is described with reference to FIGS. 3 and 4.

As shown in FIG. 4, the conventional SOC band control method includes a step of monitoring the current SOC value, a step of determining the orientation of the SOC value with a predetermined hysteresis, a step of determining an SOC strategy value based on the current SOC value, and a step of controlling the operating point of the vehicle based on the SOC strategy value.

For example, as shown in FIG. 3, the SOC strategy values are divided into critical low range 0 (SOC 0 to 25), low range 1 (SOC 25 to 40), normal range 2 (SOC 40 to 70), high range 3 (SOC 70 to 80), and critical high range 4 (SOC 80 to 100).

The SOC strategy value is determined based on the SOC value transmitted from a battery controller (BMS), and a hysteresis is determined such that the SOC strategy value is not suddenly changed by the current SOC value. That is, the hysteresis is predetermined such that the SOC strategy value is not suddenly changed by the current SOC value, and the orientation of the SOC value is determined by the predetermined hysteresis.

However, when the SOC strategy value is determined based on only the current SOC value, it is difficult to maintain the SOC strategy value in the normal range 2 in the event of a sudden change in the outside air temperature at a particular destination where it is expected to use an substantial amount of electricity by an auxiliary electrical load such as an air conditioner.

The above information disclosed in this Background section is only for enhancement of understanding of the background of the invention and therefore it may contain information that does not form the prior art that is already known in this country to a person of ordinary skill in the art.

SUMMARY OF THE DISCLOSURE

In one aspect, the present invention provides a battery's state-of-charge (SOC) balancing control method for a hybrid vehicle, the method including: monitoring a current SOC value; recognizing an outside air temperature at a traveling destination; calculating an SOC compensation value based on the outside air temperature at the traveling destination; determining an SOC strategy value in accordance with the calculated SOC compensation value; and controlling the operating point of the vehicle based on the determined SOC strategy value.

Preferably, orientation of the SOC value is determined based on a predetermined hysteresis.

Preferably, the determined SOC strategy value has a value obtained by subtracting from the current SOC value an SOC comparison value corresponding to an estimated amount of power consumed by an air conditioner at the traveling destination such that the determined SOC strategy value falls within a low range thereby enabling the battery to be charged.

Suitably, the outside air temperature at a particular destination may be automatically recognized when the destination is input into a navigation system.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g. fuels derived from resources other than petroleum). As referred to herein, a hybrid vehicle is a vehicle that has two or more sources of power, for example both gasoline-powered and electric-powered vehicles.

The above and other features of the invention are discussed infra.

BRIEF DESCRIPTION OF THE DRAWINGS

The above and other features of the present invention will now be described in detail with reference to certain exemplary embodiments thereof illustrated the accompanying drawings which are given hereinbelow by way of illustration only, and thus are not limitative of the present invention, and wherein.

Figure 1:
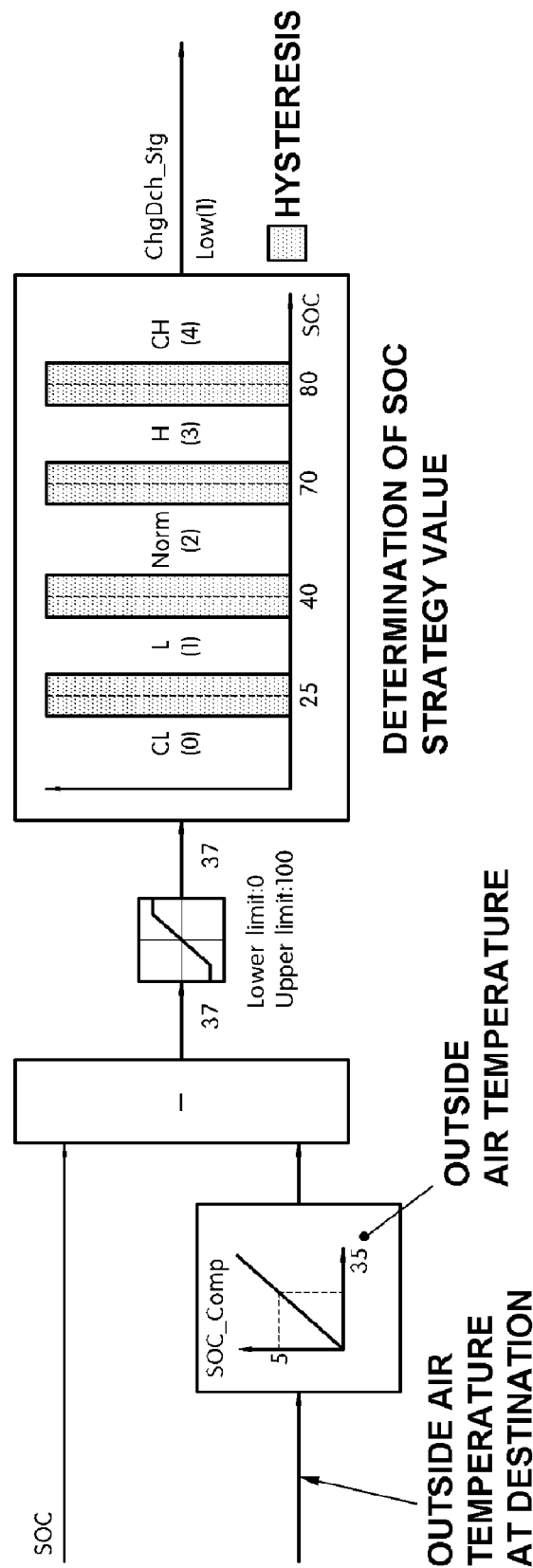
FIG. 1 is a control block diagram showing a battery's state-of-charge (SOC) balancing control method for a hybrid vehicle in accordance with an exemplary embodiment of the present invention.

It should be understood that the appended drawings are not necessarily to scale, presenting a somewhat simplified representation of various preferred features illustrative of the basic principles of the invention. The specific design features of the present invention as disclosed herein, including, for example, specific dimensions, orientations, locations, and shapes will be determined in part by the particular intended application and use environment.

In the figures, reference numbers refer to the same or equivalent parts of the present invention throughout the several figures of the drawing.

DETAILED DESCRIPTION

Hereinafter reference will now be made in detail to various embodiments of the present invention, examples of which are illustrated in the accompanying drawings and described below. While the invention will be described in conjunction with exemplary embodiments, it will be understood that present description is not intended to limit the invention to those exemplary embodiments. On the contrary, the invention is intended to cover not only the exemplary embodiments, but also various alternatives, modifications, equivalents and other embodiments, which may be included within the spirit and scope of the invention as defined by the appended claims.

Figure 3:
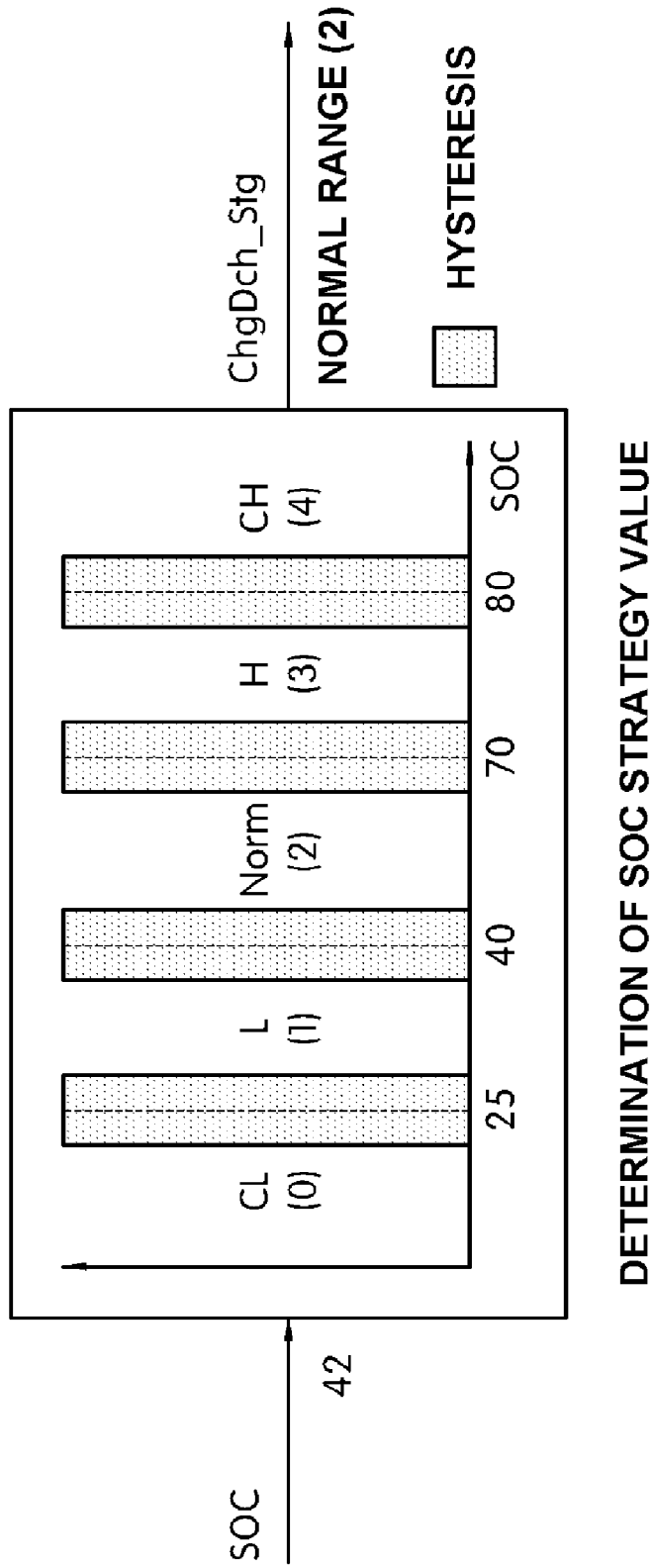
FIG. 3 is a control block diagram showing a conventional battery's SOC balancing control method for a hybrid vehicle.
Figure 4:
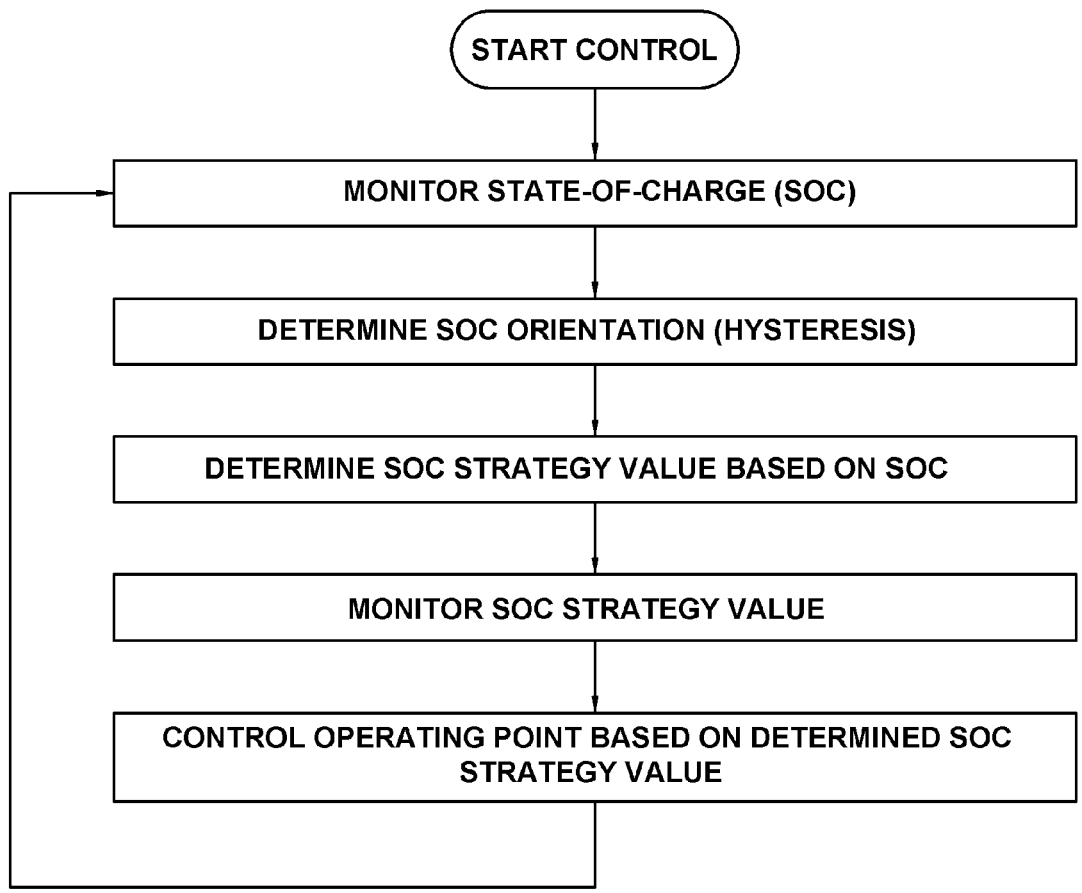
FIG. 4 is a flowchart illustrating a conventional battery's SOC balancing control method for a hybrid vehicle.

For a better understanding of the present invention, it is described how an SOC strategy value is determined in a conventional SOC balancing control method with reference to FIG. 3. According to the conventional SOC balancing control method, for example, in a state where the current SOC value is 42, the current outside air temperature is 25° C., and the outside air temperature at a particular traveling destination is 35° C., the SOC strategy value is determined by considering the current SOC value transmitted from a battery controller (BMS) without considering the outside air temperature at a particular traveling destination. As a result, the SOC strategy value 42 is determined to fall within the normal range 2 (SOC 40 to 70).

That is, according to the conventional method, in a state where the current SOC strategy value is 42 but the amount of electrical energy to be used to operate an air conditioner, an auxiliary electrical load, at or toward the traveling destination is increased, it is determined that the battery does not need to be charged at present.

As a result, when the vehicle reaches the destination and the air conditioner is turned on in a state where the current SOC value falls within the normal range 2 (SOC 40 to 70), the hybrid vehicle operates in a discharge operating point, and thereby the battery's SOC may be reduced to a point below the normal range.

According to the present invention, on the other hand, the SOC strategy value is determined by considering the outside air temperature at a particular destination besides the current SOC value.

Figure 2:
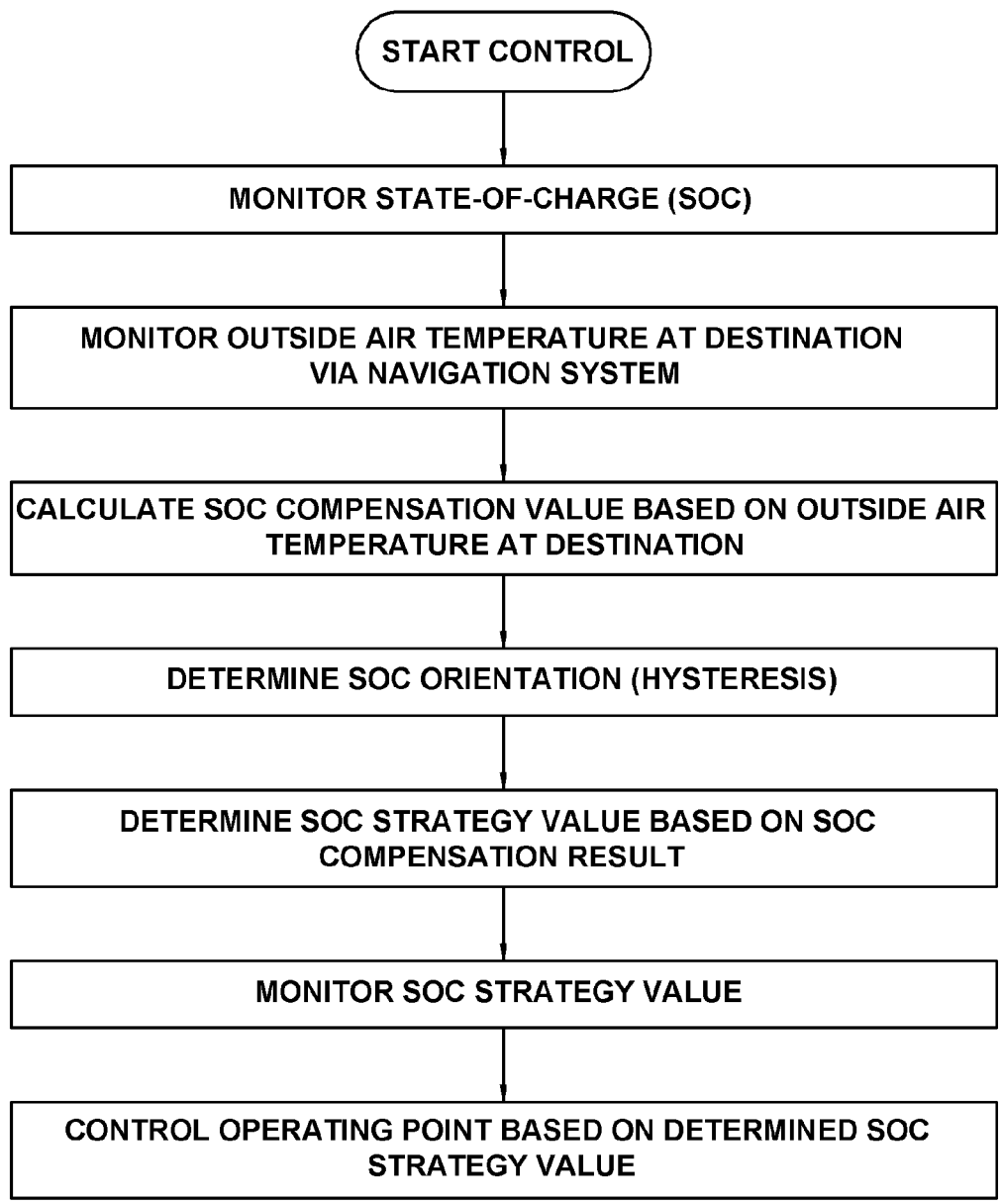
FIG. 2 is a flowchart illustrating a battery's SOC balancing control method for a hybrid vehicle in accordance with an exemplary embodiment of the present invention.

A method for determining an SOC strategy value in an SOC balancing control of a high voltage battery in accordance with an exemplary embodiment of the present invention will be described below with reference to FIGS. 1 and 2.

First, the battery controller monitors the current SOC value and recognizes the outside air temperature at a particular destination. Preferably, the outside air temperature at a particular destination may be input directly by a driver or automatically recognized when the driver inputs the destination into a navigation system.

The SOC strategy value is determined in accordance with a final SOC compensation value calculated based on the outside air temperature at the destination such that the SOC value, obtained by subtracting the SOC compensation value from the current SOC value considering the outside air temperature at the destination, falls within the range of 0 to 100. For example, when the current SOC value is 42, the current outside air temperature is 25° C., and the outside air temperature at the destination is recognized as 35° C., a strategy control (feed-forward control), in which the battery is charged in advance in the expectation that the use of the air conditioner is increased when the vehicle reaches the destination, is performed. That is, if the estimated amount of power to be consumed by the air conditioner at the temperature of the destination (i.e., an SOC comparison value SOC_Comp) is 5, the strategy determination input value for determining the SOC strategy value is 37, a value in the low range 1, which is obtained by subtracting the SOC comparison value SOC_Comp 5, from the current SOC value 42.

In the case where the SOC strategy value is above the normal range 2 (SOC 40 to 70), the hybrid vehicle operates in a discharge operating point. Whereas, when the SOC strategy value is below the normal range, the hybrid vehicle operates in a charge operating point.

Therefore, as the thus determined SOC strategy value falls within the low range 1 (SOC 25 to 40), the hybrid vehicle operates in the charge operating point, and the battery's SOC is charge-oriented controlled based on the determined SOC strategy value, thereby charging the battery. As a result, the SOC value can be controlled to maintain in the normal range.

According to the present invention, since the SOC strategy value is determined by considering the outside air temperature at a particular destination besides the current SOC value, it is possible to provide an efficient SOC balancing control. That is, since the SOC strategy value is determined in the expectation of an increase in the auxiliary electrical load, it is possible to maintain the SOC strategy value in the normal range, thereby providing an efficient SOC balancing control.

The invention has been described in detail with reference to preferred embodiments thereof. However, it will be appreciated by those skilled in the art that changes may be made in these embodiments without departing from the principles and spirit of the invention, the scope of which is defined in the appended claims and their equivalents.

What is claimed is:

1. A battery's state-of-charge (SOC) balancing control method for a hybrid vehicle, the method comprising:
   monitoring a current SOC value;
   recognizing an outside air temperature at a traveling destination;
   calculating a SOC compensation value based on the outside air temperature at the traveling destination;
   determining a SOC strategy value in accordance with the calculated SOC compensation value; and
   controlling the operating point of the vehicle based on the determined SOC strategy value,
   wherein the determined SOC strategy value has a value obtained by subtracting from the current SOC value a SOC comparison value corresponding to an estimated amount of power consumed by an air conditioner at the traveling destination such that it falls within a low range thereby enabling the battery to be charged.

2. The method of claim 1, further comprising determining the orientation of the SOC value based on a predetermined hysteresis.

3. The method of claim 1, wherein the outside air temperature at a particular destination is automatically recognized when the destination is input into a navigation system.

* * * * *